Nov. 12, 1968 R. W. STEELE 3,411,153

PLURAL-SIGNAL ANALOG-TO-DIGITAL CONVERSION SYSTEM

Filed Oct. 12, 1964 3 Sheets-Sheet 1

INVENTOR.
ROBERT W. STEELE
BY
Fordyce A. Bothwell
ATTORNEY

INVENTOR.
ROBERT W. STEELE
BY Fordyce A. Bothwell
ATTORNEY

PLURAL-SIGNAL ANALOG-TO-DIGITAL CONVERSION SYSTEM

Filed Oct. 12, 1964 3 Sheets-Sheet 3

INVENTOR.
ROBERT W. STEELE
BY Fordyce A. Rothwell
ATTORNEY

United States Patent Office 3,411,153
Patented Nov. 12, 1968

3,411,153

PLURAL-SIGNAL ANALOG-TO-DIGITAL CONVERSION SYSTEM

Robert W. Steele, Philadelphia, Pa., assignor to Philco-Ford Corporation, a corporation of Delaware Filed Oct. 12, 1964, Ser. No. 403,310
11 Claims. (Cl. 340—347)

ABSTRACT OF THE DISCLOSURE

Analog to digital conversion apparatus wherein a vogad output is analyzed via N band pass and low pass filter channels and the channel outputs are sequentially sampled by a sawtooth ramp type analog to digital converter organization. An auxiliary circuit is included for automatically adjusting the dynamic range of the converter ramp signal and includes spectrum detectors for deriving maximum and minimum components of the analyzed analog input. The spectrum is processed in circuitry for automatically adjusting the limits of the ramp sawtooth of the converter.

This invention relates to systems in which a plurality of analog signal voltages are converted to sequential digital code. An example of such a system is the well known channel vocoder system in which a speech signal is translated into a plurality of analog signal voltages which are successively and repetitively sampled and are converted to sequential digital code. The present invention, while not limited to the vocoder system, is applicable thereto as an improvement and it will be described herein as thus applied.

The principle object of this invention is to improve systems of the above-mentioned type by increasing the precision of the analog-to-digital conversion of the sampled analog signal voltages.

In prior systems of the type here involved, the analog-to-digital conversion has been carried out with a fixed pre-set dynamic range of the conversion apparatus, and this has tended to cause lack of precision in the conversion of the time-multiplexed analog signal voltages. This objection is overcome, in accordance with the present invention, by automatically adjusting the dynamic range of the conversion apparatus, prior to each sampling of the analog signal voltages, according to the minimum-to-maximum range of said voltages whose analog-to-digital conversion is to be effected.

In practicing the present invention it is convenient to utilize techniques which, while generally known, have not heretofore been envisioned or applied for the purpose of this invention. A known form of analog-to-digital conversion apparatus is one in which the conversion is effected by counting pulses for the length of time it takes a sawtooth or ramp voltage to equal the amplitude of the analog voltage being converted. The counted pulses represent the digital quantization of the voltage being converted. The sawtooth or ramp voltage may be produced by charge and discharge of a capacitor.

In practice of the present invention it is convenient to employ conversion apparatus of the kind above mentioned and to adjust the dynamic range of the apparatus through control of the limits of operation of the sawtooth or ramp generator. More particularly, prior to each sequential sampling of the analog signal voltages, the minimum and maximum amplitudes of said voltages may be detected and the sawtooth or ramp generator may be controlled accordingly as hereinafter described to establish its limits of operation, thereby to establish the dynamic range of the analog-to-digital conversion apparatus.

The invention may be fully understood from the following detailed description with reference to the accompanying drawings wherein FIG. 1 is a graph illustrating the improvement provided by the present invention over prior art systems of the type here involved;

Figure 1:
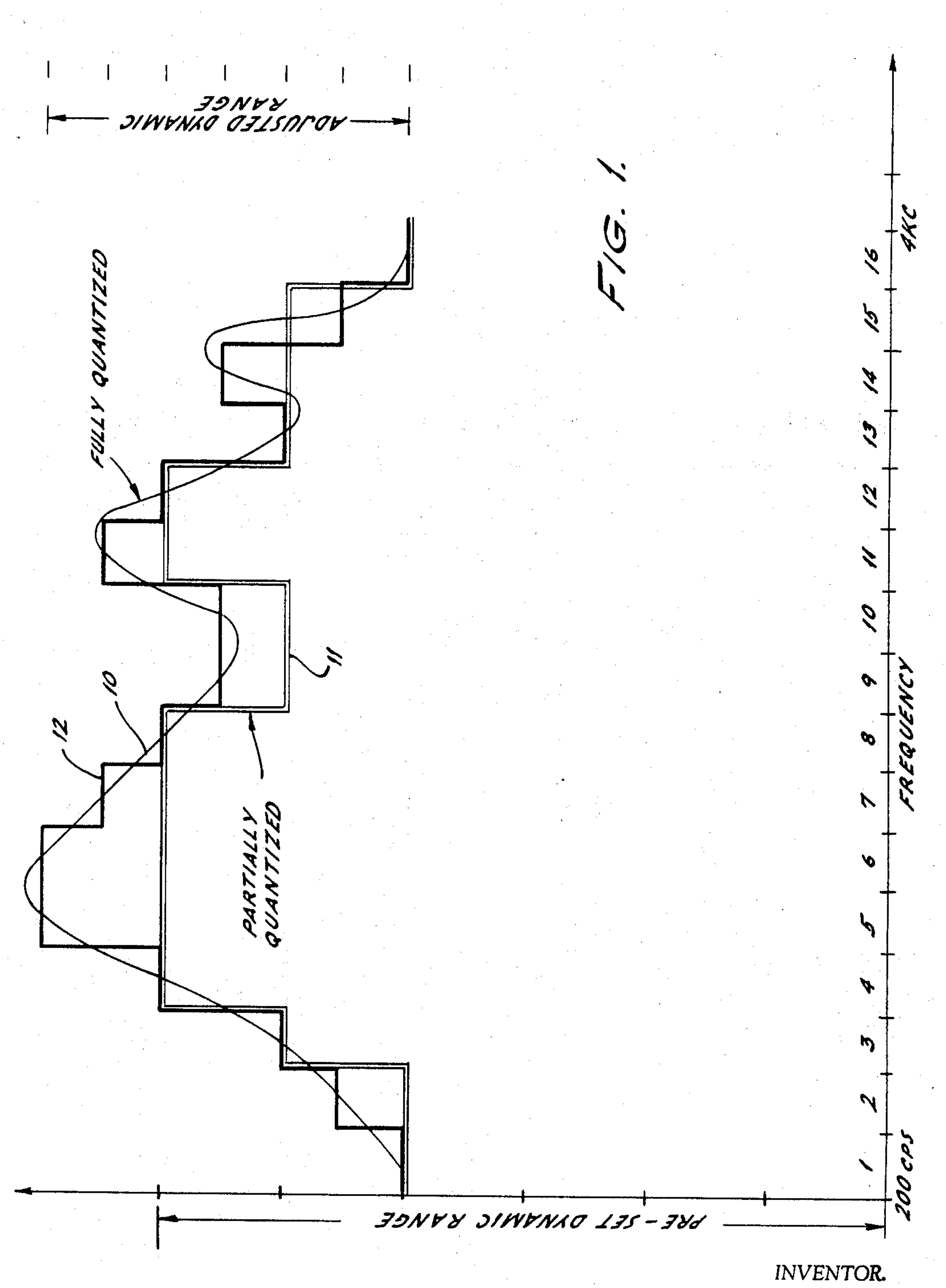

Referring more particularly to the drawings, FIG. 1 illustrates graphically how the present invention overcomes a serious disadvantage of prior systems of the type here involved. Suppose, for example, that the analog-to-digital conversion apparatus of a prior art system has the pre-set dynamic range depicted at the left side of FIG. 1, and that the apparatus is adapted for quantization of a signal at the levels indicated at the left side of FIG. 1 which represent different values of a digital code. Suppose further that at a given time the signal derived by sampling has the waveform illustrated at 10. Suppose also that the speech spectrum from 200 c.p.s. to 4 kc. is divided into sixteen channels, as represented at the bottom of the figure, each of which represents a quantum in the conversion process, i.e. a unit of quantization of a waveform such as that shown. It is apparent at once that with the indicated pre-set dynamic range the waveform 10 cannot be fully quantized due to its relation to said range. The limited or partial quantization of waveform 10 which can be effected by the system is shown by the double line representation 11.

Now in accordance with the present invention, before the quantization is effected the dynamic range of the conversion apparatus is adjusted according to the minimum-to-maximum range, as represented at the right side of the figure. Then the quantization is as represented by the heavy line representation 12. Thus with this invention the signal is fully and more accurately quantized.

Figure 2:
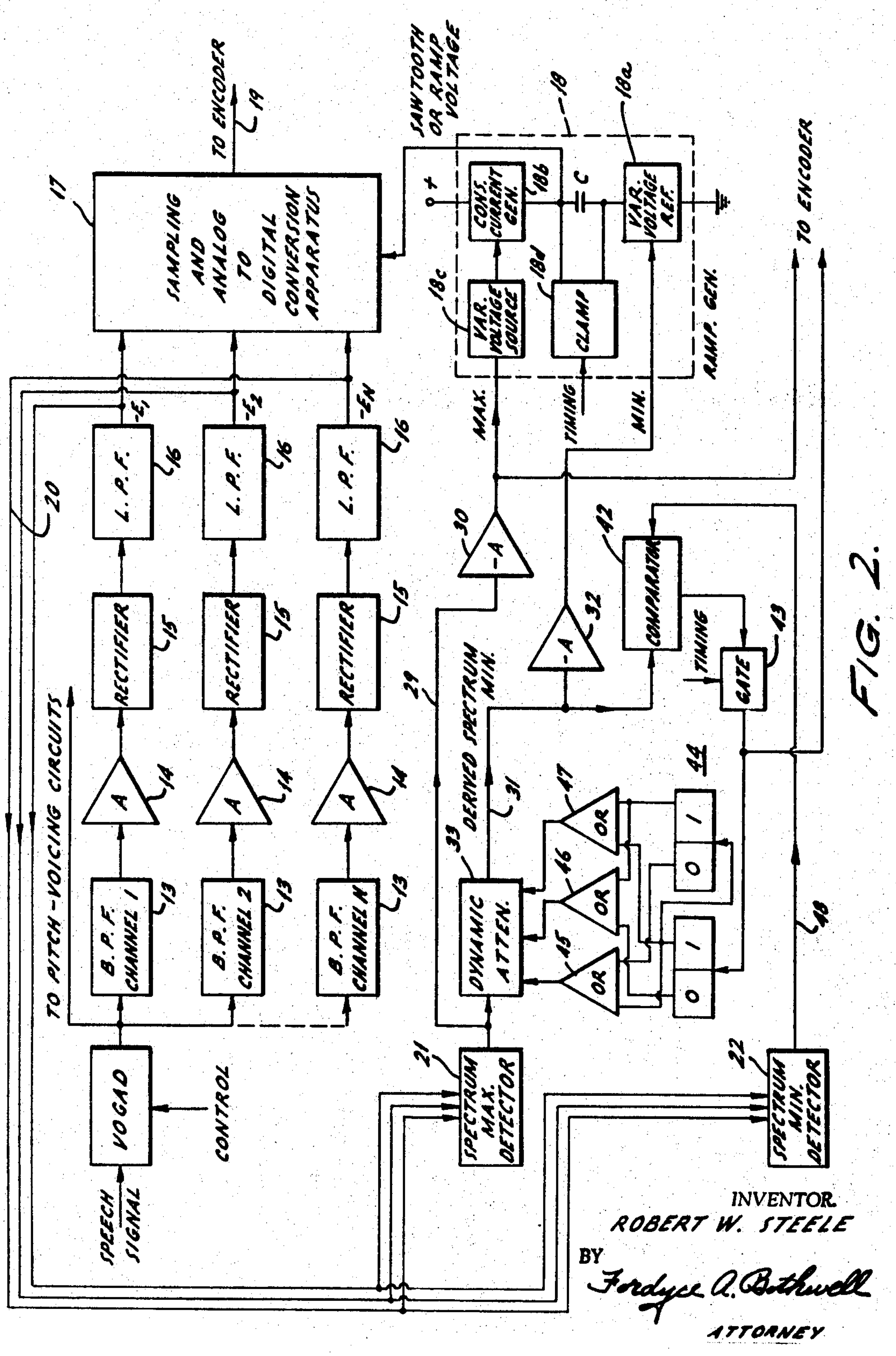
FIG. 2 is a block diagram of a system embodying this invention.

Referring now to FIG. 2, the present invention is illustrated therein as applied to the known channel vocoder system. As is customary in such a system, the input speech signal is first passed through the conventional vogad (voice-operated gain adjusting device), in which the volume is automatically adjusted to a desired level. The vogad output is supplied to the conventional analyzing apparatus which includes band pass filters 13 for N channels, amplifiers 14, rectifiers 15, and low pass filters 16. By way of example, there may be sixteen channels as indicated in FIG. 1. The outputs of the low pass filters are supplied to apparatus 17 wherein they are sequentially sampled and the resulting analog waveform such as shown at 10 in FIG. 1 is converted to a digital signal, utilizing the sawtooth or ramp voltage supplied from generator 18. The digital signal appears at the output 19.

Analog-to-digital conversion apparatus of this character is described in the Convention Record of the Institute of Radio Engineers, 1953 National Convention, part 7, Electronic Computers, in an article entitled *Multichannel Analog Input-Output Conversion System for Digital Computer*.

As thus far described the system is conventional, and in the past the analog-to-digital conversion apparatus had a pre-set dynamic range as described above with reference to FIG. 1.

In accordance with the present invention, prior to each sequential sampling of the outputs of filters 16, the dynamic range of the conversion apparatus is adjusted according to the minimum-to-maximum range of the signals to be sampled. Since the waveform derived by sampling (such as waveform 10 in FIG. 1) is made up of the signals at the outputs of filters 16, the minimum and maximum signals represent the minimum and maximum of said waveform. The dynamic range of the conversion apparatus is adjusted by establishing the limits of the sawtooth or ramp voltage produced by the generator 18.

Figure 3:
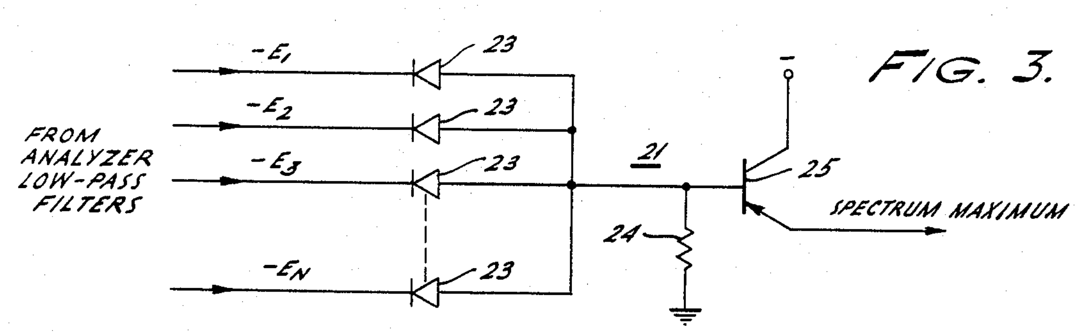
FIG. 3 is a schematic illustration of the spectrum maximum detector of FIG. 2.
Figure 4:
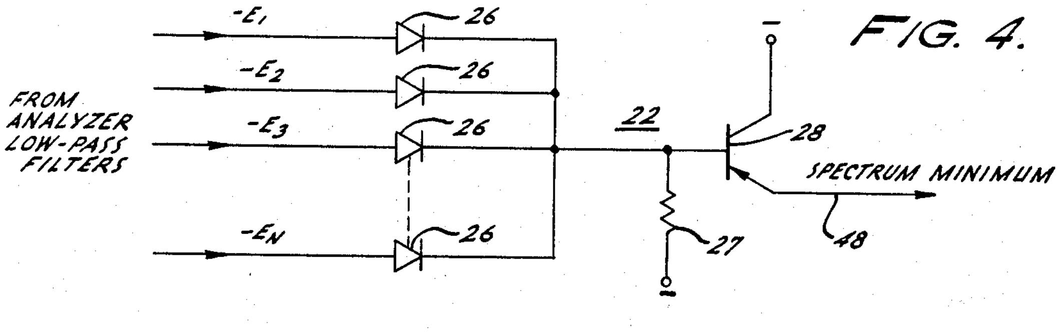
FIG. 4 is a schematic illustration of the spectrum minimum detector of FIG. 2.

To this end, the signals ($-E_1$, $-E_2$, etc.) at the outputs of the low pass filters 16 are supplied over conductors 20 to devices 21 and 22 which are designated respectively as a "spectrum maximum detector" and a "spectrum minimum detector," and which may be of the forms shown in FIGS. 3 and 4.

As shown in FIG. 3, the spectrum maximum detector may comprise diodes 23 poled as shown and connected to a common load resistor 24. The voltage developed across resistor 24 serves to control a transistor 25 and causes the voltage at the emitter to equal the voltage across resistor 24. The maximum signal level is detected due to the conduction of the diode at which the maximum signal voltage appears. The voltage across resistor 24 due to the maximum signal is effective to back bias all of the other diodes and prevent them from conducting. Thus the maximum signal level is selectively detected.

As shown in FIG. 4, the spectrum minimum detector 22 similarly may comprise diodes 26 connected to a common load resistor 27 and a transistor 28. In this case however the diode connections are reversed and a negative bias voltage is applied to the lower end of resistor 27. The minimum signal level is detected by the conduction of the proper diode and the consequent back biasing of the other diodes. In other words the voltage across resistor 27 back biases the other diodes sufficiently to prevent their conduction and also causes a minimum voltage to appear at the emitter of transistor 28.

Referring again to FIG. 2, the range of operation of the sawtooth or ramp voltage generator 18 is established by the spectrum maximum which is supplied to the generator over connection 29 and through amplifier 30, and by a voltage designated as the "derived spectrum minimum" which is derived at conductor 31 as hereinafter described and is supplied to the generator 18 through amplifier 32. The sawtooth or ramp voltage is produced by the charging of a capacitor C which is periodically discharged under control of timing pulses supplied to clamp 18*d*. The charging current is supplied from a constant current generator 18*b*. The derived spectrum minimum is supplied to the variable voltage reference 18*a* to establish the starting voltage of the ramp and also to control the rate of charge of the capacitor in inverse relation to said minimum. The spectrum maximum is supplied to the variable voltage source 18*c* to control the charging rate in direct relation to said maximum, thereby to establish the upper limit of the ramp.

While the invention contemplates the use of any suitable apparatus for the components 18*a* to 18*d*, it is convenient to employ conventional transistor devices as follows. The variable voltage reference 18*a* may comprise a transistor whose conductivity is controlled by the derived spectrum minimum. The constant current generator 18*b* may comprise a DC source and a series resistor, and the charging rate may be controlled by means of a transistor serially included in the charging circuit. The variable voltage source 18*c* may comprise a transistor stage whose collector voltage varies according to the spectrum maximum applied to its base, said collector voltage being applied to the base of the last-mentioned transistor to control the charging rate. The clamp 18*d* may comprise a transistor connected in shunt with capacitor C and turned on periodically by timing pulses to discharge the capacitor.

The derived spectrum minimum is derived by attenuating the spectrum maximum voltage to an extent determined by the actual spectrum minimum. This is accomplished in the manner now to be described.

Figure 5:
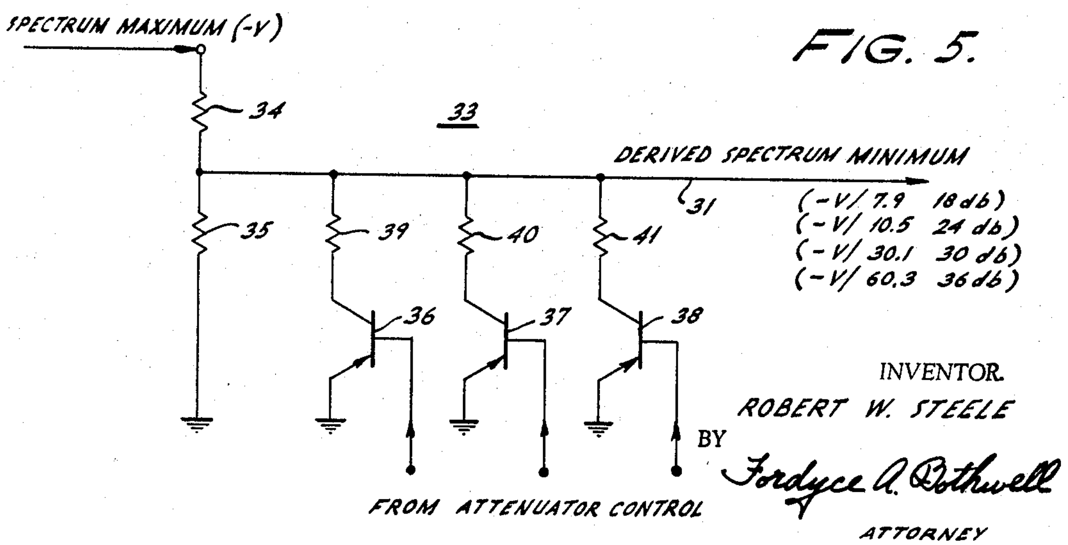
FIG. 5 is a schematic illustration of the dynamic attenuator of FIG. 2.

The spectrum maximum, in addition to being supplied to generator 18, is supplied to a device 33 designated "dynamic attenuator" which may be of the form shown in FIG. 5. This device, under control of associated devices to be referred to presently, attenuates the spectrum maximum through any one of a number of predetermined ranges to produce the derived spectrum minimum, depending on the value of the actual spectrum minimum. As shown in FIG. 5, this dynamic attenuator may consist of a voltage dividing and attenuating arrangement comprising resistors 34 and 35 and transistors 36 to 38 whose collector resistors 39 to 41 act as attenuators. Resistors 34 and 35, connected to the emitter of transistor 25 (FIG. 3), provide a voltage according to the spectrum maximum. By turning the transistors 36 to 38 on and off selectively, the required attenuation is obtained through insertion of the collector resistors in the "on" condition and removal of the collector resistors in the "off" condition. The number of transistors required depends on the number of dynamic ranges desired to describe speech. In the illustrated arrangement four different ranges are available. In other words the spectrum maximum may be attenuated through any one of the four ranges to establish the derived spectrum minimum. The four ranges are established as follows: (1) with all three transistors turned off; (2) with transistor 36 alone turned on; (3) with transistor 37 alone turned on; and (4) with transistor 38 alone turned on.

The proper attenuation range is selected through control of transistors 36 to 38 by the attenuator control arrangement which, as shown in FIG. 2, comprises a comparator 42, a gate 43, a counter 44 and OR gates 45 to 47. The actual spectrum minimum is supplied to comparator 42 over connection 48, while the derived spectrum minimum is supplied to the comparator over connection 31.

The two-stage counter 44 has four possible binary conditions. It is stepped by timing pulses supplied through gate 43 which is controlled by comparator 42. The OR gates control the dynamic attenuator 33 according to the condition of the counter. For example suppose that the four binary conditions of the counter are as follows.

| | | | |
|---|---|---|---|
| 0 | 1 | 0 | 1 |
| 1 | 0 | 0 | 1 |
| 0 | 1 | 1 | 0 |
| 1 | 0 | 1 | 0 |

Suppose further that each OR gate will not produce an output if either of its inputs is ONE, i.e. both inputs must be ZERO. With the connections as shown, in the first condition above there is no output from the OR gates. In the second condition there is an output from OR gate 45. In the third condition there is an output from OR gate 46. In the fourth condition there is an output from OR gate 47.

In operation, prior to each sampling sequence the actual spectrum maximum and the actual spectrum minimum are detected by detectors 21 and 22, and a particular derived spectrum minimum appears at the output of the dynamic attenuator 33 due to the setting of counter 44. The range adjustment cycle begins at this point. The comparator 42 indicates the offset of the actual and derived spectrum minimums on a step basis, which opens gate 43 and causes activation of counter 44. This produces a new derived spectrum minimum or reference level, and the cycle repeats. When the derived spectrum minimum "matches" the actual spectrum minimum, the comparator does not indicate a step and the gate 43 is closed. The derived spectrum minimum, matched to the actual spectrum minimum, is now available along with the actual spectrum maximum to establish the range of operation of the sawtooth generator 18.

It will be seen from the foregoing description that in the system as illustrated the derived spectrum minimum is developed as a measure of the ratio between the spectrum maximum and the spectrum minimum. The number of timing pulses supplied to counter 44 (one to four in this case) is an indicator of the ratio.

The output of gate 43 and the output of amplifier 30 are supplied to the encoder for transmission so as to enable decoding at the receiver.

While a preferred embodiment of the invention has been illustated and described, it will be understood that the invention is not limited thereto but contemplates such modifications and further embodiments as may occur to those skilled in the art.

I claim:

1. In combination, a source of a plurality of analog signal voltages to be converted to sequential digital code, first means coupled to said source for determining the minimum-to-maximum amplitude range of said voltages, second means coupled to said source for successively converting said voltages to digital form to produce said code, and third means coupled between said first means and said second means for establishing the dynamic range of said second means according to said minimum-to-maximum range determined by said first means prior to the conversion of said voltages.

2. In combination, a source of a plurality of analog signal voltages to be repetitively successively sampled and converted to sequential digital code, first means coupled to said source for determining the minimum-to-maximum amplitude range of said voltages before each sampling sequence, second means coupled to said source for sampling said voltages, third means coupled to said second means for converting the samples to digital form to produce said code, and fourth means coupling said first means to said third means for establishing the dynamic range of said third means according to said minimum-to-maximum range determined by said first means prior to each sampling sequence.

3. In combination, a source of a plurality of analog signal voltages to be repetitively successively sampled and converted to sequential digital code, first means coupled to said source for determining the minimum and maximum amplitudes of said voltages and for producing control signals representative of said maximum and minimum amplitudes before each sampling sequence, second means coupled to said source for sampling said voltages, third means coupled to said second means for converting the samples to digital form to produce said code, and fourth means coupling said first means to said third means for establishing the dynamic range of said third means according to said control signals prior to each sampling sequence.

4. In combination, a source of a plurality of analog signal voltages to be repetitively successively sampled and converted to sequential digital code, first means coupled to said source for determining the minimum and maximum amplitudes of said voltages and for producing control signal representative of said maximum and minimum amplitudes before each sampling sequence, second means coupled to said source for sampling said voltages, third means coupled to said second means for converting the samples to digital form to produce said code, said third means including a sawtooth generator, and fourth means coupling said first means to said third means for utilizing said control signals to establish the limits of the generated sawtooth and thus establish the dynamic range of said third means prior to each sampling sequence.

5. In combination, a source of a plurality of analog signal voltages to be repetitively successively sampled and converted to sequential digital code, first means foı detecting and deriving the minimum and maximum of said voltages before each sampling sequence, second means coupled to said first means for establishing one of a number of predetermined amplitude ranges according to said minimum and maximum voltages, third means coupled to said source for sampling the signal voltages supplied by said source, fourth means coupled to said third means for converting the samples to digital form to produce said code, and fifth means coupling said second means to said fourth means for defining the dynamic range of said fourth means according to the established one of said predetermined amplitude ranges prior to each sampling sequence.

6. In combination, a source of a plurality of analog signal voltages to be repetitively successively sampled and converted to sequential digital code, first means coupled to said source for detecting and deriving the minimum and maximum of said voltages before each sampling sequence, second means coupled to said first means for establishing one of a number of predetermined amplitude ranges according to said minimum and maximum voltages, third means coupled to said source for sampling the signal voltages supplied by said source, fourth means coupled to said third means for converting the samples to digital form to produce said code, said fourth means including a sawtooth generator, and fifth means coupling said second means to said fourth means for defining the limits of the generated sawtooth according to the established one of said predetermined amplitude ranges so as to establish the dynamic range of said fourth means prior to each sampling sequence.

7. In a speech transmission system, first means for translating a speech signal into a plurality of analog voltages to be repetitively successively sampled and converted to sequential digital code, second means coupled to the first means for determining the minimum-to-maximum amplitude range of said voltages before each sampling sequence, third means coupled to said first means for sampling said voltages, fourth means coupled to said third means for converting the samples to digital form to produce said code, and fifth means coupling said second means to said fourth means for establishing the dynamic range of said fourth means according to said minimum-to-maximum amplitude range prior to each sampling sequence.

8. In a speech transmission system, first means for translating a speech signal into a plurality of analog voltages to be repetitively successively sampled and converted to sequential digital code, second means coupled to the first means for determining the minimum and maximum amplitudes of said voltages and for producing control signals representative of said minimum and maximum amplitudes before each sampling sequence, third means coupled to said first means for sampling said voltages, fourth means coupled to said third means for converting the samples to digital form to produce said code, and fifth means coupling said second means to said fourth means for establishing the dynamic range of said fourth means according to said control signals prior to each sampling sequence.

9. In a speech transmission system, first means for translating a speech signal into a plurality of analog voltages to be repetitively successively sampled and converted to sequential digital code, second means coupled to said first means for determining the minimum-to-maximum amplitude range of said voltages before each sampling sequence, third means coupled to said first means for sampling said voltages, fourth means coupled to said third means for converting the samples to digital form to produce said code, said fourth means including a sawtooth generator, and fifth means coupling said second means to said fourth means to establish the limits of the generated sawtooth according to said range, thereby to establish the dynamic range of said fourth means, prior to each sampling sequence.

10. In a speech transmission system, first means for translating a speech signal into a plurality of analog voltages to be repetitively successively sampled and converted to digital code, second means coupled to said first means for detecting the minimum and maximum amplitudes of said voltages before each sampling sequence, third means coupled to said second means for selecting one of a number of predetermined dynamic amplitude ranges according to said amplitudes detected by said second means and for producing control signals definitive of the selected range, fourth means coupled to said first means for sampling said voltages, fifth means coupled to said fourth means for converting the samples to digital form to produce said code, and sixth means coupling said third means to said fifth means for establishing the dynamic range of said fifth means according to said control signals prior to each sampling sequence.

11. In a speech transmission system, first means for translating a speech signal into a plurality of analog voltages to be repetitively successively sampled and converted to sequential digital code, second means coupled to said first means for detecting the minimum and maximum amplitudes of said voltages before each sampling sequence, third means coupled to said second means for selecting one of a number of predetermined dynamic ranges according to said amplitudes determined by said second means and for producing control signals definitive of the selected range, fourth means coupled to said first means for sampling said voltages, fifth means coupled to said fourth means for coverting the samples to digital form to produce said code, said fifth means including a sawtooth generator, and sixth means coupling said third means to said fifth means for utilizing said control signals to establish the limits of the sawtooth generated by said sawtooth generator and thus establish the dynamic range of said fifth means prior to said sampling sequence.

References Cited

UNITED STATES PATENTS

| | | | |
|---|---|---|---|
| 2,724,740 | 11/1955 | Cutler | 325—38 |
| 2,897,486 | 7/1959 | Alexander et al. | 340—347 |
| 2,941,196 | 6/1960 | Raynsford et al. | 340—347 |
| 3,017,626 | 6/1962 | Muller | 340—347 |
| 3,075,147 | 1/1963 | Llewellyn | 325—43 |
| 3,105,231 | 9/1963 | Gordon et al. | 340—347 |
| 3,267,459 | 8/1966 | Chomicki et al. | 340—347 |
| 3,277,462 | 10/1966 | Sekimoto | 340—347 |
| 3,292,150 | 12/1966 | Wood | 340—149 |
| 3,298,016 | 1/1967 | Reeves et al. | 340—347 |

MAYNARD R. WILBUR, *Primary Examiner.*

W. J. KOPACZ, *Assistant Examiner.*